(12) United States Patent
Zhang et al.

(10) Patent No.: US 10,496,450 B2
(45) Date of Patent: Dec. 3, 2019

(54) SELECTIVE TEMPERATURE COMPENSATION

(71) Applicant: SanDisk Technologies LLC, Plano, TX (US)

(72) Inventors: Ming Zhang, San Jose, CA (US); Feng Gao, Union City, CA (US); Qing Li, Los Gatos, CA (US); Xiaoyu Yang, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 212 days.

(21) Appl. No.: 15/601,733

(22) Filed: May 22, 2017

(65) Prior Publication Data

US 2018/0335813 A1    Nov. 22, 2018

(51) Int. Cl.
G11C 7/04 (2006.01)
G06F 9/52 (2006.01)
G05B 15/02 (2006.01)
G11C 29/02 (2006.01)

(52) U.S. Cl.
CPC ............. *G06F 9/528* (2013.01); *G05B 15/02* (2013.01); *G11C 7/04* (2013.01); *G11C 29/028* (2013.01)

(58) Field of Classification Search
CPC ......... G11C 29/00; G06F 1/206; G06F 9/528; G05B 15/06
USPC ............................................ 365/211, 230.01
See application file for complete search history.

(56) References Cited

U.S. PATENT DOCUMENTS

| | | |
|---|---|---|
| 9,202,579 B2 | 12/2015 | Hsiung et al. |
| 2017/0206954 A1* | 7/2017 | Lee ................. G11C 13/004 |
| 2018/0268891 A1* | 9/2018 | Li ................... G11C 11/4091 |

* cited by examiner

*Primary Examiner* — Han Yang
(74) *Attorney, Agent, or Firm* — Vierra Magen Marcus LLP

(57) ABSTRACT

Apparatuses, systems, methods, and computer program products are disclosed for selective temperature compensation. An apparatus includes a compensation circuit that applies temperature compensation to an operation based on a temperature detected by a temperature sensor. An apparatus includes a command circuit that receives a lock command. An apparatus includes a lock circuit that locks a temperature compensation applied to an operation in response to receiving a lock command such that the temperature compensation is based on a fixed temperature.

20 Claims, 10 Drawing Sheets

SELECTIVE TEMPERATURE COMPENSATION

TECHNICAL FIELD

The present disclosure, in various embodiments, relates to temperature compensation for performing operations and more particularly relates to selective temperature compensation.

BACKGROUND

Many electrical circuits and devices, such as data storage devices or the like, use temperature compensation. Temperature compensation may be used to adjust for variations that occur in operations due to temperature change, for example. Noise may occur when using temperature compensation resulting in erroneous errors.

SUMMARY

Apparatuses are presented for selective temperature compensation. In one embodiment, an apparatus includes a compensation circuit that applies temperature compensation to an operation based on a temperature detected by a temperature sensor. An apparatus, in certain embodiments, includes a command circuit that receives a lock command. An apparatus, in one embodiment, includes a lock circuit that locks a temperature compensation applied to an operation in response to receiving a lock command such that the temperature compensation is based on a fixed temperature.

Systems are presented for selective temperature compensation. A system, in one embodiment, includes a controller. In various embodiments, a system includes an array of memory devices. In some embodiments, each memory device of an array of memory devices is configured to receive a command from a controller that indicates whether to hold information corresponding to a temperature compensation for performing multiple operations. In a further embodiment, each memory device of an array of memory devices is configured to, in response to a command indicating to hold information corresponding to temperature compensation, holding the information such that multiple operations use the same information for performing the temperature compensation.

An apparatus for selective temperature compensation, in one embodiment, includes means for receiving a lock command that indicates to lock information corresponding to a temperature detected by a temperature sensor. In some embodiments, an apparatus includes means for performing temperature compensation using a locked information such that temperature compensation is performed based on a fixed temperature.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
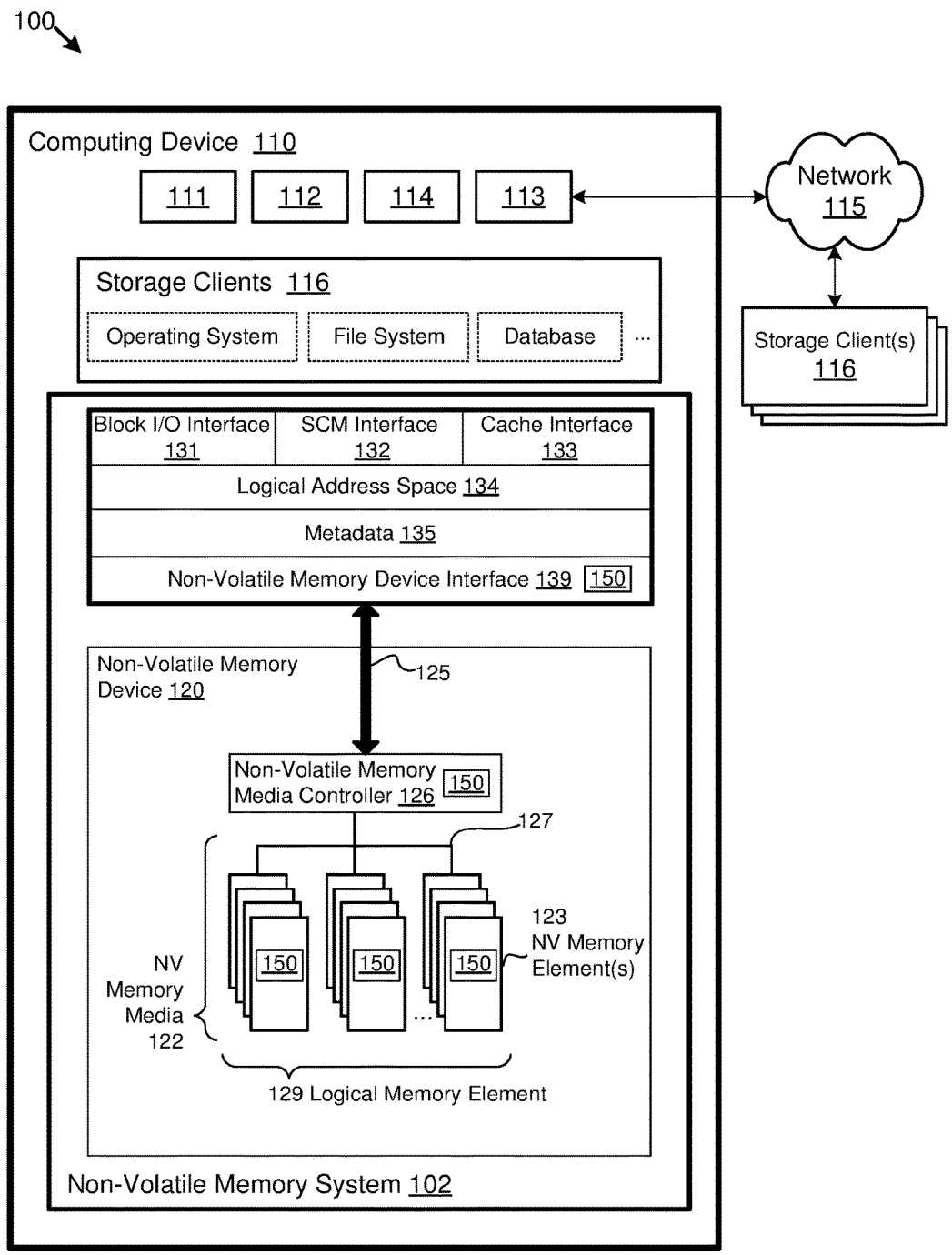
FIG. 1A is a schematic block diagram illustrating one embodiment of a system for selective temperature compensation.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a temperature compensation component 150 for a non-volatile memory device 120. The temperature compensation component 150 may be part of and/or in communication with a non-volatile memory media controller 126, a non-volatile memory element 123, a device driver, or the like. The temperature compensation component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the temperature compensation component 150 may be embodied as one or more computer readable instructions stored on the non-transitory storage medium 114.

The non-volatile memory system 102, in the depicted embodiment, includes a temperature compensation component 150. The temperature compensation component 150, in one embodiment, is configured to selectively use temperature compensation for the non-volatile memory device 120 described below. The temperature compensation component 150, in certain embodiments, may receive a command from a controller that indicates whether to hold information corresponding to a temperature compensation for performing multiple operations. The temperature compensation component 150 may also compare, in response to a command indicating to hold information corresponding to temperature compensation, holding the information such that multiple operations use the same information for performing the temperature compensation. Thus, temperature compensation may be selectively used.

In one embodiment, the temperature compensation component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the temperature compensation component 150 may comprise executable software code, such as a device driver or the like, stored on the computer readable storage medium 114 for execution on the processor 111. In a further embodiment, the temperature compensation component 150 may include a combination of both executable software code and logic hardware.

In one embodiment, the temperature compensation component 150 is configured to receive storage requests from a device driver or other executable application via a bus 125 or the like. The temperature compensation component 150 may be further configured to transfer data to/from a device driver and/or storage clients 116 via the bus 125. Accordingly, the temperature compensation component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the temperature compensation component 150 may receive storage requests as an API call from a storage client 116, as an IO-CTL command, or the like.

According to various embodiments, a non-volatile memory controller 126 in communication with one or more temperature compensation components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
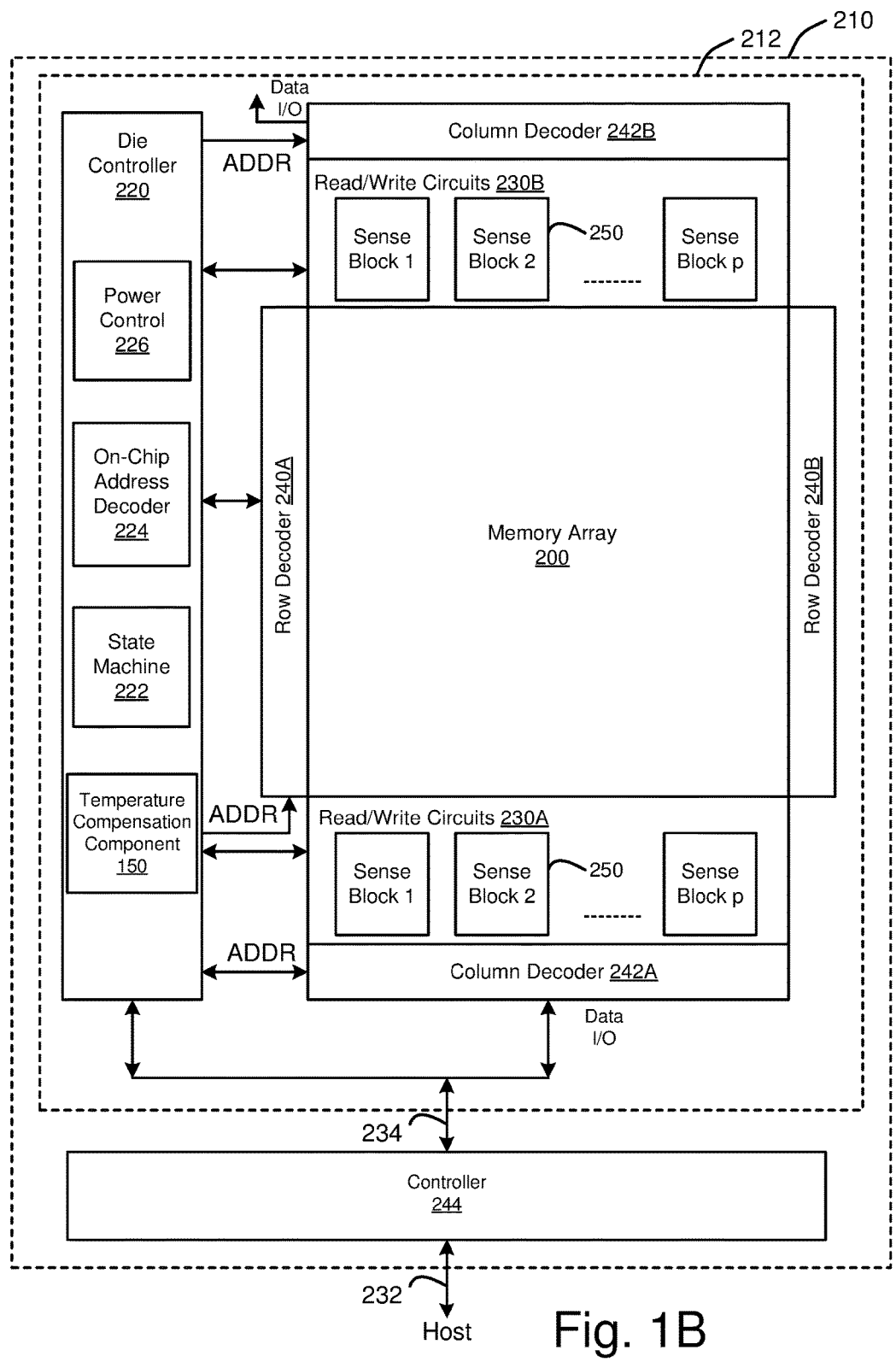
FIG. 1B is a schematic block diagram illustrating another embodiment of a system for selective temperature compensation.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a temperature compensation component 150, a state machine 222, and an on-chip address decoder 224. In one embodiment, the state machine 222 comprises at least a portion of the temperature compensation component 150. In a further embodiment, the controller 244 comprises at least a portion of the temperature compensation component 150. In various embodiments, one or more of the sense blocks 250 comprises at least a portion of the temperature compensation component 150.

The temperature compensation component 150, in one embodiment, is configured to apply temperature compensation to an operation based on a temperature detected by a temperature sensor, receive a lock command, and lock the temperature compensation applied to the operation in response to receiving the lock command such that the temperature compensation is based on a fixed temperature.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the temperature compensation component 150. The temperature compensation component 150, in certain embodiments, is embodied as software in a device driver, hardware in a device controller 244, and/or hardware in a die controller 220 and/or state machine 222.

In one embodiment, one or any combination of die controller 220, temperature compensation component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
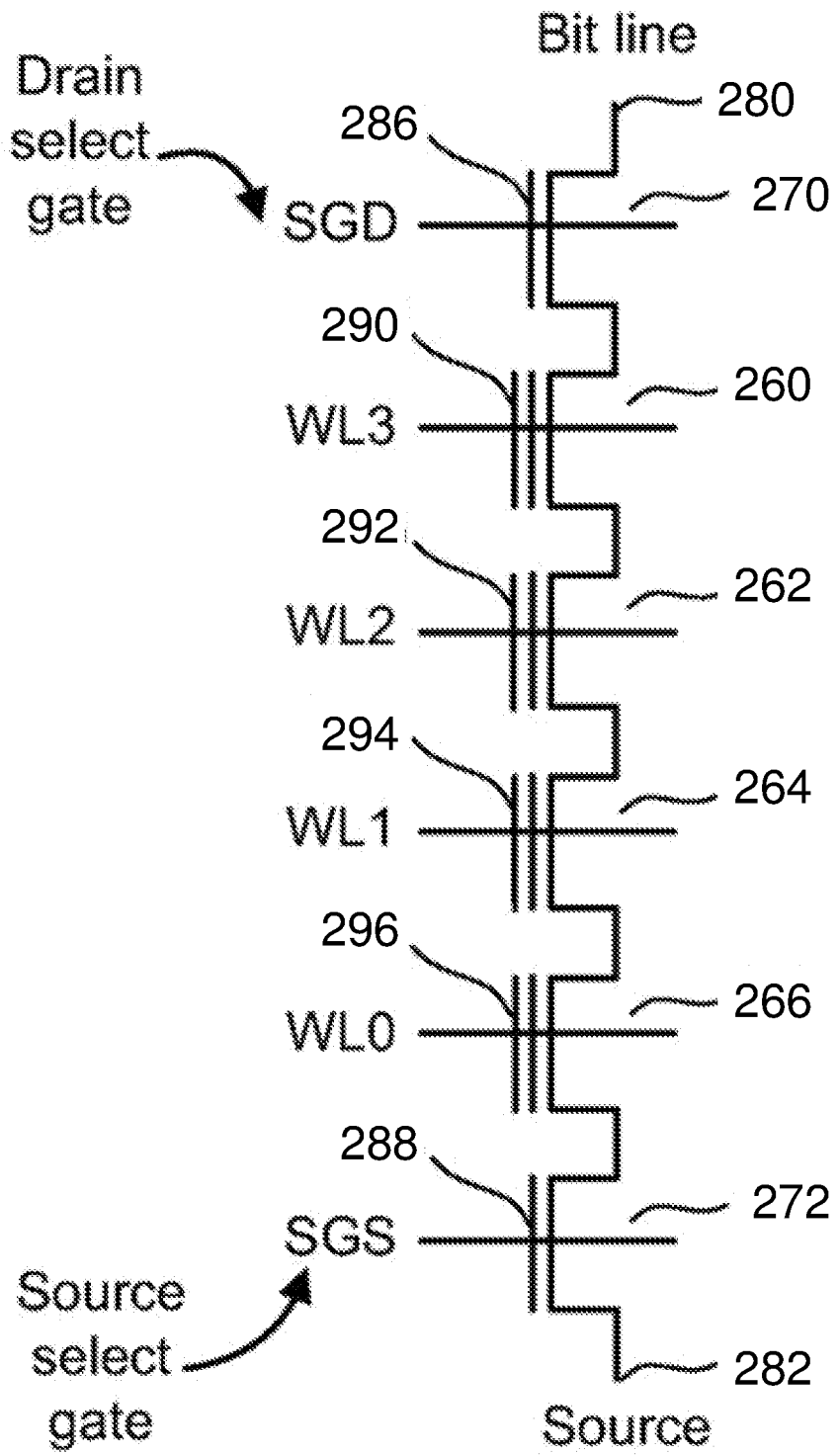
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the temperature compensation component 150 controls whether temperature compensation applied to a storage device, such as a NAND string, uses a fixed temperature or a current temperature.

Figure 3:
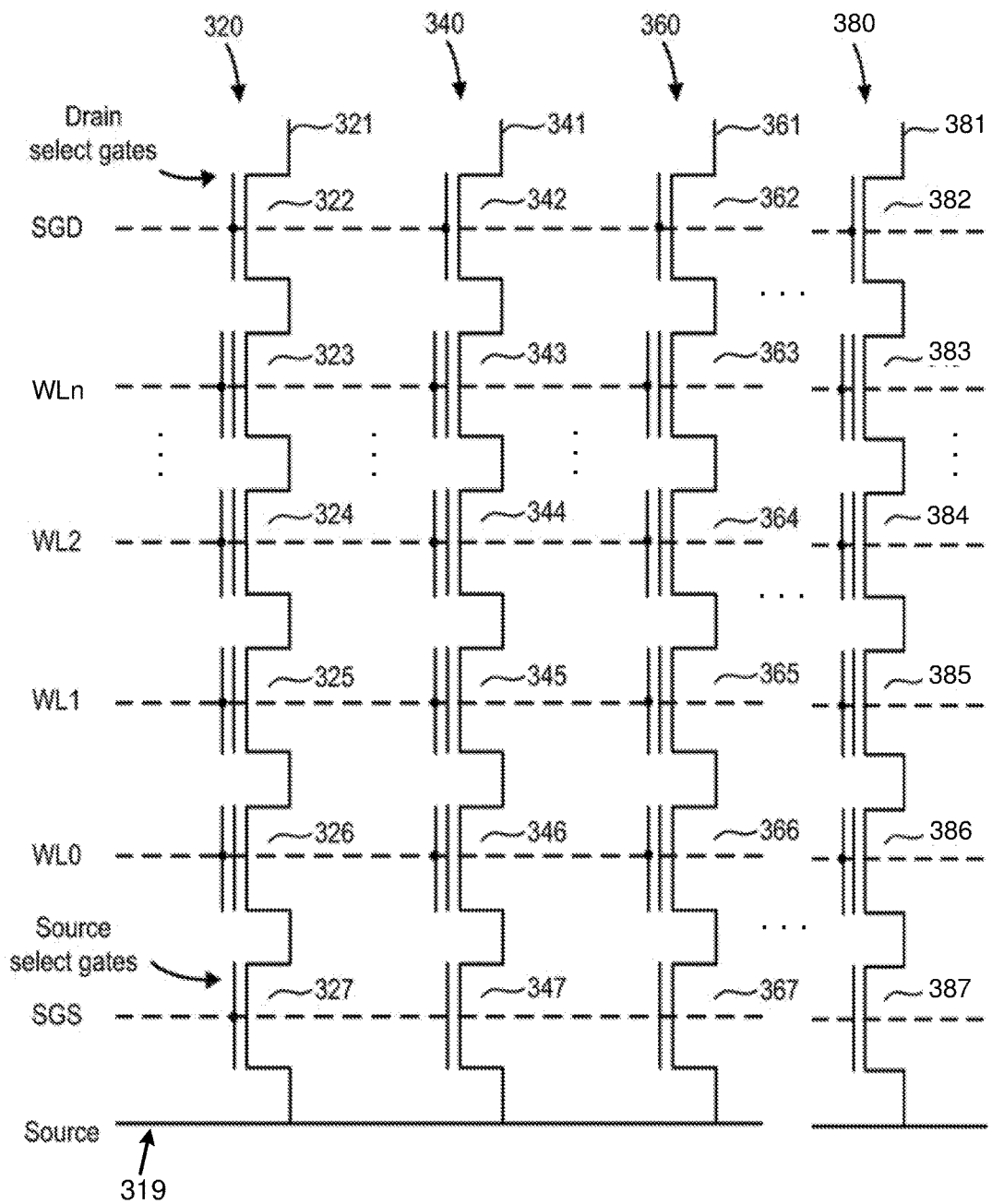
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, temperature compensation used for sensing data on the storage elements 323-326, 343-346, 363-366, 383-386 may be noisy resulting in reduced sensing accuracy. In such an embodiment, the temperature compensation component 150 may selectively hold temperature compensation used for sensing data on the storage elements 323-326, 343-346, 363-366, 383-386 based on a command indicating to hold the temperature compensation.

Figure 4:
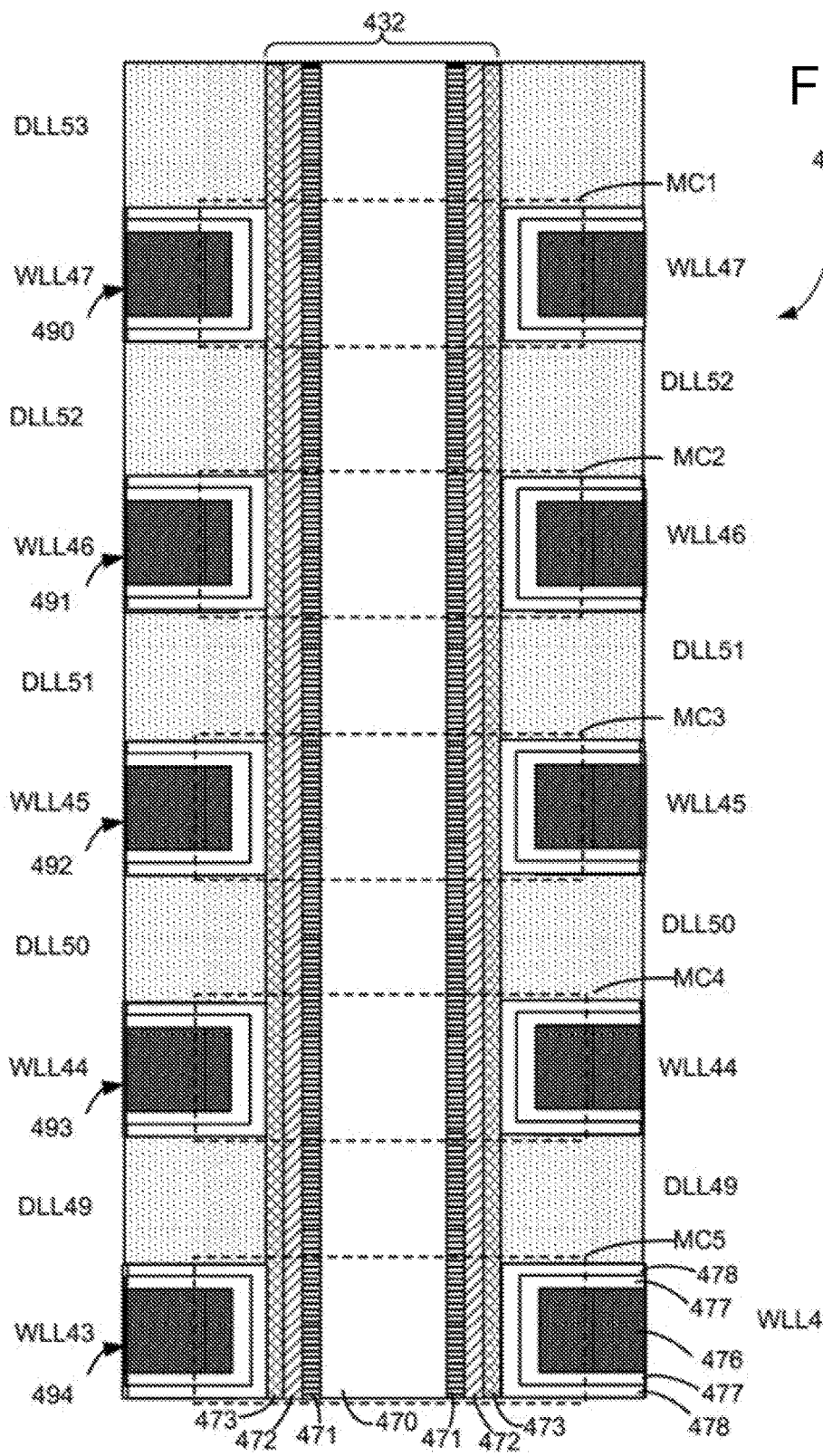
FIG. 4 illustrates one embodiment of a 3D, vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429)

on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
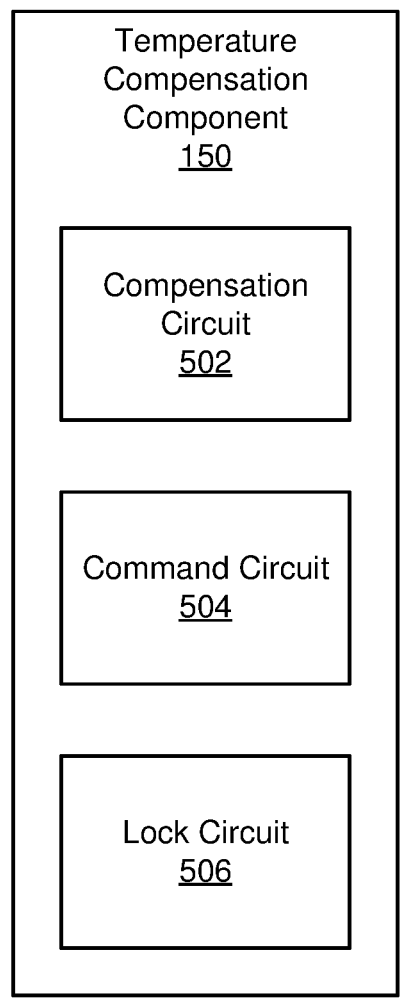
FIG. 5 is a schematic block diagram illustrating one embodiment of a temperature compensation component.

FIG. 5 depicts one embodiment of a temperature compensation component 150. The temperature compensation component 150 may be substantially similar to the temperature compensation component 150 described above with regard to FIGS. 1A, 1B, 2, and/or 3. In general, as described above, the temperature compensation component 150 applies temperature compensation to an operation based on a temperature detected by a temperature sensor, receives a lock command, and locks the temperature compensation applied to the operation in response to receiving the lock command such that the temperature compensation is based on a fixed temperature. Accordingly, the temperature compensation component 150 may facilitate reducing erroneous errors that occur due to noise when using temperature compensation. In the depicted embodiment, the temperature compensation component 150 includes a compensation circuit 502, a command circuit 504, and a lock circuit 506.

In various embodiments, the compensation circuit 502 applies temperature compensation to an operation based on a temperature detected by a temperature sensor (e.g., measured by a temperature sensor, sensed by a temperature sensor, etc.). In one embodiment, an "operation" may refer to a procedure performed in the context described in FIGS. 1A through 4. In other embodiments, an "operation" may refer to a procedure performed with non-storage circuits. In some embodiments, the temperature detected by the temperature sensor may be a current sensed temperature (e.g., real-time sensed temperature). In certain embodiments, the temperature detected by the temperature sensor may be a fixed temperature. The fixed temperature may be sensed at a specific time, then stored so that the stored temperature may be used as the fixed temperature.

In one embodiment, the compensation circuit 502 may use temperature coefficients ("TCO") as part of the temperature compensation. The TCO may correspond to multiple parameters, such as a bit line clamping voltage, a drain-to-source voltage, a drain induced barrier lowering, a threshold voltage, and/or other parameters. As used herein, "temperature compensation" may refer to adjusting results and/or processing of an operation relative to a temperature (e.g., sensed temperature, measured temperature, fixed temperature). In some embodiments, TCO may be adjusted based on a fixed temperature at certain predetermined temperatures (e.g., 0° C., 43° C., etc.) and may be based on a sensed temperature at other temperatures.

In certain embodiments, the command circuit 504 receives one or more commands. The commands may include a lock command for locking the temperature compensation applied to operations, an unlock command for unlocking the temperature compensation applied to operations, and/or an operation command (e.g., read, write, program, verify, etc.). As used herein, to "unlock" temperature compensation may mean that temperature compensation is performed using variable values based on a measured temperature that changes in response to a temperature change. In some embodiments, the command circuit 504 may receive one or more commands from a controller, a processor, a memory device, or another device. In various embodiments, the command circuit 504 may receive a command from a controller that indicates whether to hold information corresponding to a temperature compensation for performing operations.

In some embodiments, the lock circuit 506 locks temperature compensation applied to an operation in response to receiving a lock command such that the temperature compensation is based on a fixed temperature. As used herein, to "lock" temperature compensation may mean that temperature compensation is performed using fixed values based on a fixed temperature that do not change in response to a temperature change. In various embodiments, the lock circuit 506 is configured to apply one or more temperature coefficients based on a fixed temperature to one or more operations that occur at temperatures different from the fixed temperature. In certain embodiments, the lock circuit 506 is configured to lock (e.g., hold, freeze) an applied temperature compensation until an unlock command (e.g., release command, unfreeze command) is received. In one embodiment, in response to a command indicating to hold information corresponding to temperature compensation, the lock circuit 506 may hold the information such that multiple operations use the same information for performing the temperature compensation.

In some embodiments, in response to a command indicating not to hold information corresponding to temperature compensation, one or more memory devices of an array of memory devices may be configured to use information such that the information is adjusted based on a sensed temperature for each operation. In various embodiments, in response to a command indicating to hold information corresponding to temperature compensation, one or more memory devices of an array of memory devices may be configured to set a parameter indicating that the information is held. In certain embodiments, in response to a command indicating not to hold information corresponding to temperature compensation, one or more memory devices of an array of memory devices may be configured to set a parameter indicating that the information is not held. In some embodiments, the information includes one or more temperature coefficients determined based on a fixed temperature. In other embodiments, the information includes a sensed temperature.

Figure 6:
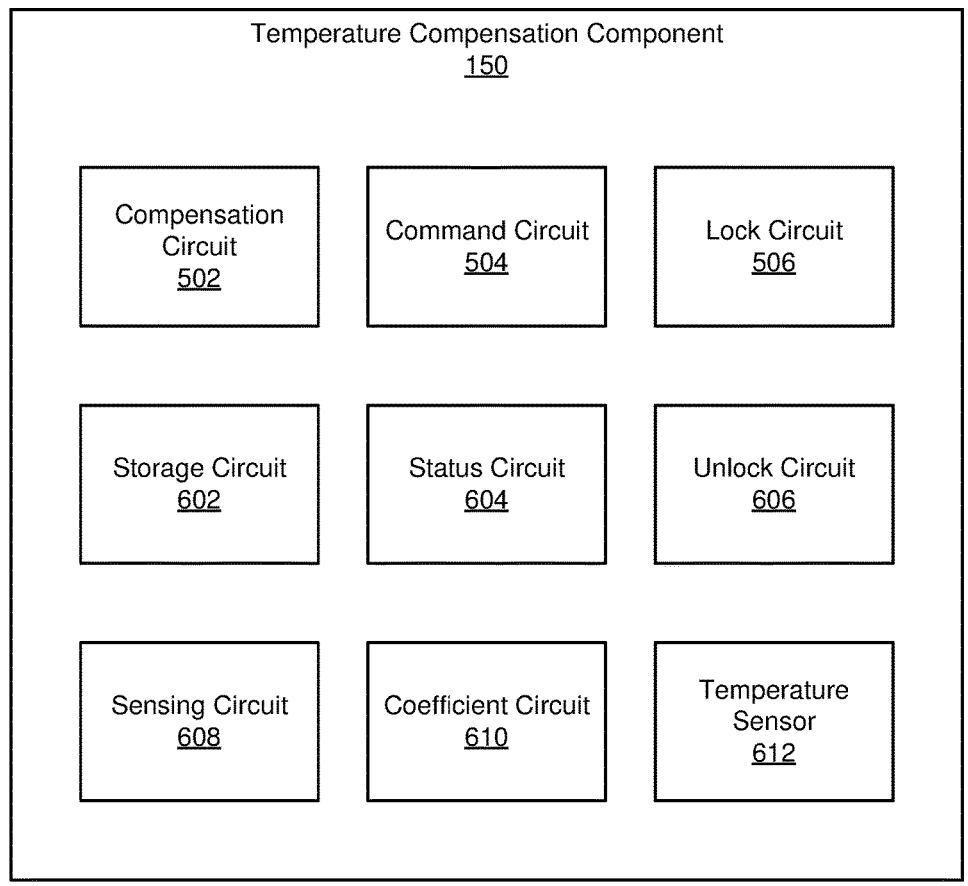
FIG. 6 is a schematic block diagram illustrating a further embodiment of a temperature compensation component.

Turning to FIG. 6, a further embodiment of a temperature compensation component 150 is illustrated. The temperature compensation component 150 may be substantially similar to the temperature compensation component 150 described above with regard to FIGS. 1A, 1B, 2, 3, and/or 5. In the depicted embodiment, the temperature compensation component 150 includes the compensation circuit 502, the command circuit 504, and the lock circuit 506 and further includes a storage circuit 602, a status circuit 604, an unlock circuit 606, a sensing circuit 608, a coefficient circuit 610, and a temperature sensor 612. The compensation circuit 502, the command circuit 504, and the lock circuit 506 may be substantially as described above with regard to FIG. 5.

In one embodiment, the storage circuit 602 is configured to store a parameter based on a temperature (e.g., a sensed temperature, a measured temperature, a detected temperature, a stored temperature, a fixed temperature). In such embodiments, locking temperature compensation applied to an operation may include applying temperature compensation based on the stored parameter instead of being based on a dynamic parameter (e.g., a parameter that changes based on a change in temperature). In some embodiments, the storage circuit 602 may store one or more TCO, one or more temperatures, and so forth. In certain embodiments, the storage circuit 602 may store a parameter in a storage device, a memory, a latch, a circuit, and/or another device.

In certain embodiments, the status circuit 604 is configured to set a lock status used by an apparatus. In some embodiments, a lock status may be set by setting a status bit, an indicator, a flip-flop circuit, a latch circuit, and/or another device. In various embodiments, a lock status may indicate whether an operation is performed with a fixed temperature or a sensed temperature. For example, in one embodiment, a lock status indicates that an operation is performed with a fixed temperature in response to receiving a lock command. As another example, in one embodiment, a lock status indicates that an operation is performed with a sensed temperature in response to receiving an unlock command.

In various embodiments, the unlock circuit 606 is configured to receive an unlock command that unlocks applied temperature compensation such that temperature compensation is based on a current temperature (e.g., sensed temperature) instead of a fixed temperature. In some embodiments, the sensing circuit 608, in response to receiving an unlock command, is configured to sense (e.g., detect, measure, etc.) a current temperature using the temperature sensor 612 and determine temperature compensation based on the current temperature. In one embodiment, the coefficient circuit 610 is configured to determine one or more TCO (corresponding to one or more parameters) based on a fixed temperature in response to the command circuit 504 receiving a lock command. In another embodiment, the coefficient circuit 610 is configured to determine one or more temperature coefficients based on a current temperature (e.g., real-time temperature, sensed temperature, detected temperature, measured temperature, etc.) in response to the command circuit 504 receiving an unlock command. In certain embodiments, the temperature sensor 612 is used to sense a temperature. The temperature sensor 612 may be any suitable sensor capable of sensing a temperature, such as a thermocouple, a thermistor, a resistance temperature detector, a semiconductor-based sensor, and/or another type of sensor.

Figure 7:
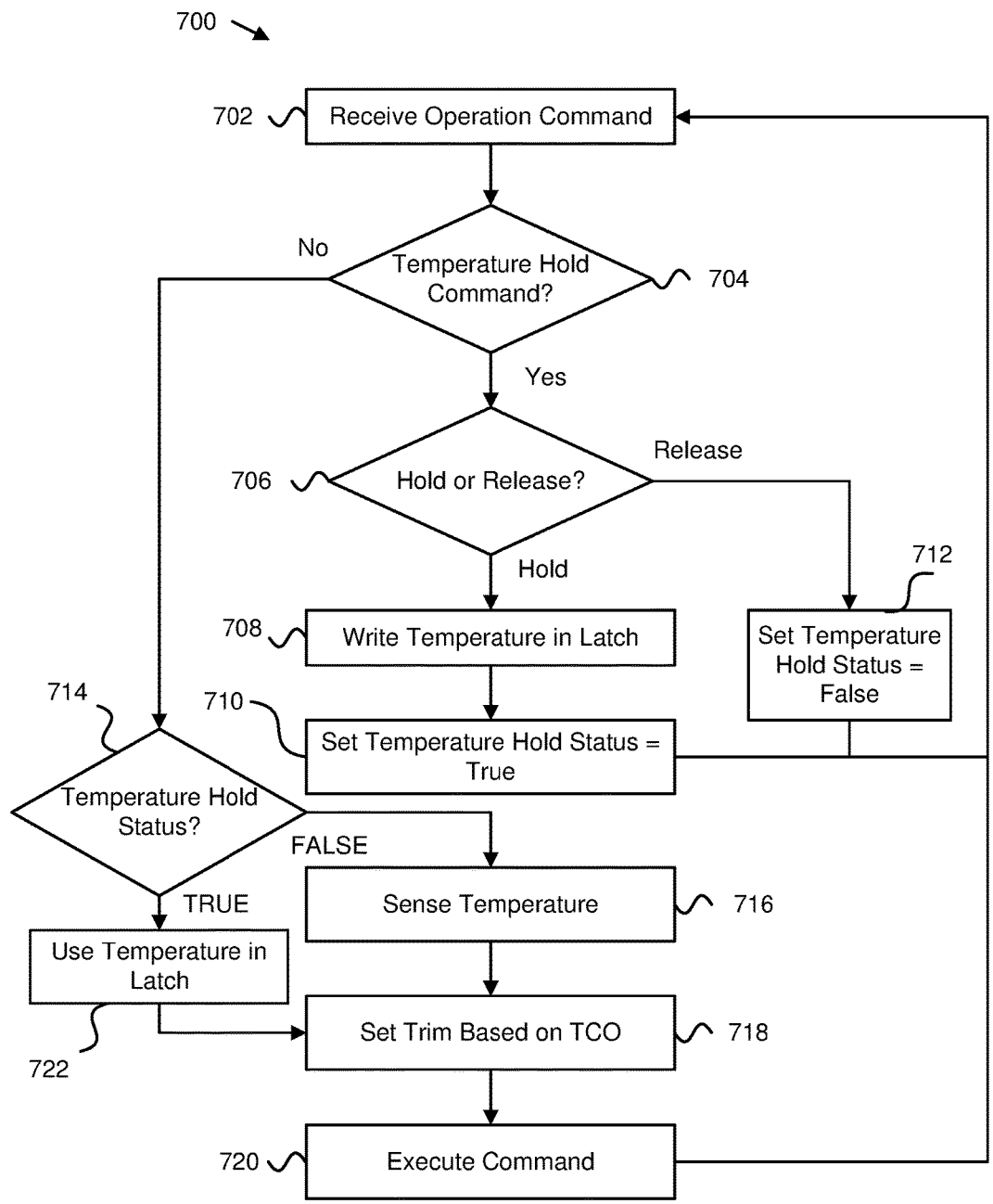
FIG. 7 is a schematic flow chart diagram illustrating one embodiment of a method for selective temperature compensation.

FIG. 7 depicts one embodiment of a method 700 for selective temperature compensation. The method 700 begins and the command circuit 504 receives 702 an operation command. The operation command may be a hold command (e.g., lock command, temperature hold command), a release command (e.g., unlock command, temperature release command), a read command, a write command, a program command, and so forth. The command circuit 504 determines 704 whether the command is a temperature hold command. In response to the command circuit 504 determining that the command is a temperature hold command, the command circuit 504 determines 706 whether the command is a hold command or a release command. In response to the command circuit 504 determining 706 that the command is a hold command, the lock circuit 506 writes 708 a sensed temperature in a latch (or another storage device) using the storage circuit 602. Moreover, the lock circuit 506 sets 710 a temperature hold status equal to true using the status circuit 604. The method 700 then returns to receiving 702 an operation command.

In response to the command circuit 504 determining 706 that the command is a release command, the lock circuit 506 sets 712 the temperature hold status equal to false using the status circuit 604. The method 700 then returns to receiving 702 an operation command.

In response to the command circuit 504 determining that the command is a temperature hold command, the compensation circuit 502 determines 714 a temperature hold status. In response to the compensation circuit 502 determining 714 that the temperature hold status is FALSE, the sensing circuit 608 senses 716 a temperature using the temperature sensor 612. Moreover, the compensation circuit 502 sets 718 a trim to apply the sensed temperature to TCO. The compensation circuit 502 then executes 720 the command. The method 700 then returns to receiving 702 an operation command.

In response to the compensation circuit 502 determining 714 that the temperature hold status is TRUE, the compensation circuit 502 uses 722 the temperature stored in the latch. Further, the compensation circuit 502 sets 718 the trim to apply the stored temperature to TCO. The compensation circuit 502 then executes 720 the command. The method 700 then returns to receiving 702 an operation command. By using the method 700, erroneous errors that occur due to noise when using temperature compensation may be reduced.

Figure 8:
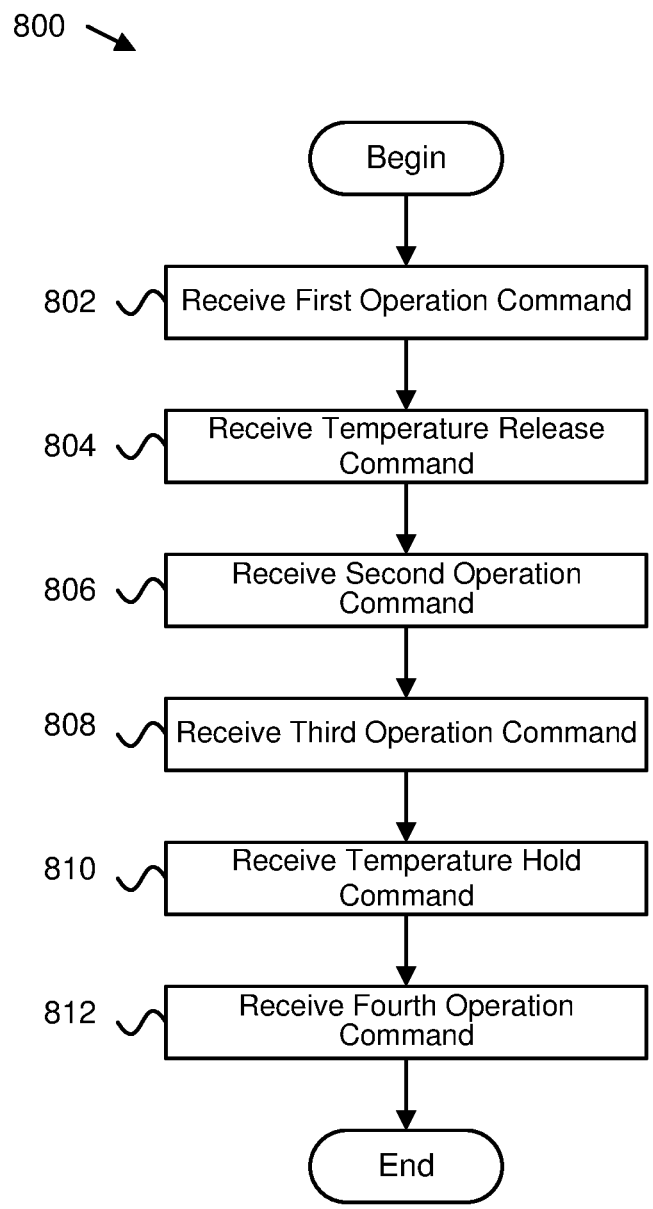
FIG. 8 is a schematic flow chart diagram illustrating a further embodiment of a method for selective temperature compensation.

FIG. 8 is a schematic flow chart diagram illustrating a further embodiment of a method 800 for selective temperature compensation. The method 800 illustrates one embodiment of commands that may be received 702 by the method 700. The method 800 begins, and the command circuit 504 receives 802 a first operation command. In this embodiment, the first operation command is received while temperature compensation is locked. Accordingly, a stored temperature is used for temperature compensation.

Moreover, the command circuit 504 receives 804 a temperature release command. Accordingly, the unlock circuit 606 unlocks applied temperature compensation such that the temperature compensation is based on a current temperature instead of the stored temperature. Further, the command circuit 504 receives 806 a second operation command. Because the temperature compensation is unlocked, temperature compensation is based on a current (e.g., sensed) temperature instead of a stored temperature. The command circuit 504 receives 808 a third operation command which also has temperature compensation based on a current temperature.

The command circuit 504 receives 810 a temperature hold command. Therefore, the lock circuit 506 locks applied temperature compensation such that the temperature compensation is based on a stored temperature instead of a current temperature. Further, the command circuit 504 receives 812 a fourth operation command. The fourth operation command is received while temperature compensation is locked so that temperature compensation is based on the stored temperature, and the method 800 ends.

Figure 9:
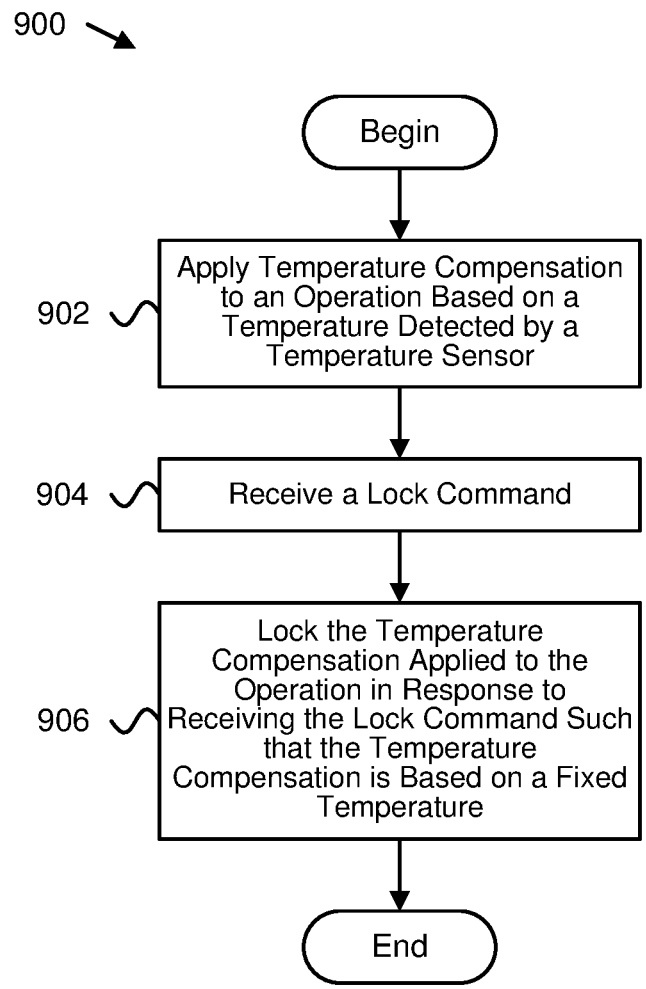
FIG. 9 is a schematic flow chart diagram illustrating another embodiment of a method for selective temperature compensation.

FIG. 9 is a schematic flow chart diagram illustrating another embodiment of a method 900 for selective temperature compensation. The method 900 begins, and the compensation circuit 502 applies 902 temperature compensation to an operation based on a temperature detected by a temperature sensor. Moreover, the command circuit 504 receives 904 a lock command. The lock circuit 506 locks 906 the temperature compensation applied to the operation in response to receiving the lock command such that the temperature compensation is based on a fixed temperature, and the method 900 ends. By using the method 900, erroneous errors that occur due to noise when using temperature compensation may be reduced.

In certain embodiments, the storage circuit 602 stores a parameter based on a temperature. In some embodiments, locking a temperature compensation applied to an operation includes applying temperature compensation based on a stored parameter. In one embodiment, the status circuit 604 sets a lock status used by an apparatus. In various embodiments, a lock status indicates whether an operation is performed with a fixed temperature or a sensed temperature. In some embodiments, a lock status indicates that an operation is performed with a fixed temperature in response to receiving a lock command. In various embodiments, a lock status indicates that an operation is performed with a sensed temperature in response to receiving an unlock command. In certain embodiments, the unlock circuit 606 receives an unlock command that unlocks an applied temperature compensation such that the temperature compensation is based on a current temperature.

In certain embodiments, in response to receiving an unlock command, the sensing circuit 608 senses a current temperature using a temperature sensor and determines a temperature compensation based on the current temperature. In some embodiments, the coefficient circuit 610 determines one or more temperature coefficients based on a fixed temperature in response to receiving a lock command. In various embodiments, a lock circuit is configured to apply one or more temperature coefficients to one or more operations that occur at temperatures different from a fixed temperature. In various embodiments, the lock circuit 506 locks an applied temperature compensation until an unlock command is received.

A means for receiving a lock command that indicates to lock information corresponding to a temperature detected by a temperature sensor, in various embodiments, may include one or more of a temperature compensation component 150, a command circuit 504, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for receiving a lock command that indicates to lock information corresponding to a temperature detected by a temperature sensor.

A means for performing temperature compensation using locked information such that a temperature compensation is performed based on a fixed temperature, in certain embodiments, may include one or more of a temperature compensation component 150, a compensation circuit 502, a command circuit 504, a lock circuit 506, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for performing temperature compensation using locked information such that a temperature compensation is performed based on a fixed temperature.

A means for storing the locked information, in some embodiments, may include one or more of a temperature compensation component 150, a storage circuit 602, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for storing the locked information.

A means for receiving an unlock command that indicates to unlock information corresponding to temperature such that a temperature compensation is performed based on a variable temperature, in one embodiment, may include one or more of a temperature compensation component 150, a compensation circuit 502, a command circuit 504, an unlock circuit 606, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for receiving an unlock command that indicates to unlock information corresponding to temperature such that a temperature compensation is performed based on a variable temperature.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a plurality of non-volatile memory cells;
   a compensation circuit that applies temperature compensation to an operation directed to the plurality of non-volatile memory cells based on a temperature detected by a temperature sensor;
   a command circuit that receives a lock command; and
   a lock circuit that locks the temperature compensation applied to the operation in response to receiving the lock command such that the temperature compensation is based on a fixed temperature.

2. The apparatus of claim 1, further comprising a storage circuit configured to store a parameter based on the temperature, wherein locking the temperature compensation applied to the operation comprises applying temperature compensation based on the stored parameter.

3. The apparatus of claim 1, further comprising a status circuit configured to set a lock status used by the apparatus, wherein the lock status indicates whether the operation is performed with the fixed temperature or a sensed temperature.

4. The apparatus of claim 3, wherein the lock status indicates that the operation is performed with the fixed temperature in response to receiving the lock command.

5. The apparatus of claim 3, wherein the lock status indicates that the operation is performed with the sensed temperature in response to receiving an unlock command.

6. The apparatus of claim 1, further comprising an unlock circuit configured to receive an unlock command that unlocks the applied temperature compensation such that the temperature compensation is based on a current temperature.

7. The apparatus of claim 6, wherein, in response to receiving the unlock command, a sensing circuit is configured to sense the current temperature using the temperature sensor and determine the temperature compensation based on the current temperature.

8. The apparatus of claim 1, further comprising a coefficient circuit configured to determine one or more temperature coefficients based on the fixed temperature in response to receiving the lock command.

9. The apparatus of claim 8, wherein the lock circuit is configured to apply the one or more temperature coefficients to one or more operations that occur at temperatures different from the fixed temperature.

10. The apparatus of claim 1, further comprising a memory device, wherein the memory device comprises the apparatus.

11. The apparatus of claim 10, wherein the memory device comprises the temperature sensor.

12. The apparatus of claim 1, wherein the lock circuit is configured to lock the applied temperature compensation until an unlock command is received.

13. A system comprising:
a controller; and
an array of memory devices, each memory device of the array of memory devices including a plurality of non-volatile memory cells, wherein each memory device of the array of memory devices is configured to:
receive a command from the controller that indicates whether to hold information corresponding to a temperature compensation for performing a plurality of operations; and
in response to the command indicating to hold the information corresponding to the temperature compensation, holding the information such that a plurality of operations directed to the plurality of non-volatile memory cells use the same information for performing the temperature compensation.

14. The system of claim 13, wherein, in response to the command indicating not to hold the information corresponding to the temperature compensation, each memory device of the array of memory devices is configured to use the information such that the information is adjusted based on a sensed temperature for performing a plurality of operations.

15. The system of claim 13, wherein, in response to the command indicating to hold the information corresponding to the temperature compensation, each memory device of the array of memory devices is configured to set a parameter indicating that the information is held.

16. The system of claim 15, wherein, in response to the command indicating not to hold the information corresponding to the temperature compensation, each memory device of the array of memory devices is configured to set a parameter indicating that the information is not held.

17. The system of claim 13, wherein the information comprises one or more temperature coefficients determined based on a fixed temperature.

18. An apparatus comprising:
a plurality of non-volatile memory cells;
means for receiving a lock command that indicates to lock information corresponding to a temperature detected by a temperature sensor;
and
means for performing temperature compensation in an operation directed to the plurality of non-volatile memory cells, the temperature compensation using the locked information such that the temperature compensation is performed based on a fixed temperature.

19. The apparatus of claim 18, further comprising means for storing the locked information.

20. The apparatus of claim 18, further comprising means for receiving an unlock command that indicates to unlock the information corresponding to the temperature such that the temperature compensation is performed based on a variable temperature.

* * * * *